United States Patent
Scheppler et al.

(10) Patent No.: US 7,348,795 B2
(45) Date of Patent: * Mar. 25, 2008

(54) CONFIGURABLE LOGIC COMPONENT WITHOUT A LOCAL CONFIGURATION MEMORY AND WITH A PARALLEL CONFIGURATION BUS

(75) Inventors: Michael Scheppler, Gröbenzell (DE); Wolfgang Gruber, Olching/Neu-Esting (DE)

(73) Assignee: Infineon Technologies AG, Munich (DE)

( * ) Notice: Subject to any disclaimer, the term of this patent is extended or adjusted under 35 U.S.C. 154(b) by 73 days.

This patent is subject to a terminal disclaimer.

(21) Appl. No.: 11/032,436

(22) Filed: Jan. 10, 2005

(65) Prior Publication Data
US 2005/0184755 A1    Aug. 25, 2005

(30) Foreign Application Priority Data
Jan. 12, 2004    (DE) ...................... 10 2004 001 669

(51) Int. Cl.
*H03K 19/173*    (2006.01)
(52) U.S. Cl. .......................................... 326/38; 326/41
(58) Field of Classification Search ............ 326/37–41, 326/93–98, 46
See application file for complete search history.

(56) References Cited

U.S. PATENT DOCUMENTS

| | | | |
|---|---|---|---|
| 5,485,105 A | | 1/1996 | Harward et al. ............... 326/38 |
| 5,861,761 A | * | 1/1999 | Kean ............................ 326/41 |
| 5,956,518 A | * | 9/1999 | DeHon et al. ................. 712/15 |
| 6,180,526 B1 | * | 1/2001 | Chang ......................... 438/692 |
| 6,331,784 B1 | * | 12/2001 | Mason et al. ................... 326/8 |
| 6,331,790 B1 | * | 12/2001 | Or-Bach et al. .............. 326/41 |
| 6,337,579 B1 | * | 1/2002 | Mochida ....................... 326/41 |
| 6,542,998 B1 | * | 4/2003 | Vorbach et al. ............. 713/400 |
| 6,627,985 B2 | | 9/2003 | Huppenthal et al. ........ 257/686 |
| 6,781,226 B2 | * | 8/2004 | Huppenthal et al. ........ 257/686 |
| 6,847,227 B2 | * | 1/2005 | Goldfinch ..................... 326/38 |
| 6,917,219 B2 | * | 7/2005 | New ............................ 326/41 |

FOREIGN PATENT DOCUMENTS

WO    WO 2004/081764 A2    9/2004

* cited by examiner

*Primary Examiner*—Don Le
(74) *Attorney, Agent, or Firm*—Brinks Hofer Gilson & Lione

(57) ABSTRACT

A configurable logic component (30) does not have a local configuration memory. The configuration of the configurable logic component is defined by applied voltages. The configuration voltages are advantageously generated in an external configuration memory (2). In one preferred refinement, a memory chip (20) (for example EEPROM) and the inventive logic component without a configuration memory (30) are mounted face-to-face. An intermediate, structured solder layer (40) makes available a plurality of electrical connections.

13 Claims, 3 Drawing Sheets

CONFIGURABLE LOGIC COMPONENT WITHOUT A LOCAL CONFIGURATION MEMORY AND WITH A PARALLEL CONFIGURATION BUS

RELATED APPLICATIONS

The present patent document claims the benefit of the filing date under 35 U.S.C. §119 of German Patent Application No. 10 2004 001 669.0, filed Jan. 12, 2004, which is hereby incorporated by reference.

BACKGROUND

The present invention relates to simplified devices and methods for quickly reprogramming a programmable logic component (PLD).

Programmable logic components (PLD, programmable logic device) are general architectures which frequently have a very regular structure for logic operations. They contain a plurality of switches which can switch a plurality of signal paths. As a result, they only receive their specific function through configuration. A PLD (FIGS. 1a and 1b) is basically composed of configurable logic cells and a configurable connection network which permits the logic cells to be logically connected as desired. The configuration of the PLD relates here both to the logic cells and to the connection network, with the possibility of making the configuration complex at the bit level or at a somewhat more complex module level. The more general the way in which a PLD can be used, the greater the expenditure on the configurability. Programmable logic components also comprise, inter alia, the important group of widespread FPGAs (Field Programmable Gate Arrays). The latter exhibit a maximum level of flexibility and therefore have a high degree of expenditure on configuration for the logic cells and the associated connection network.

The configuration is basically either irreversible (one-time programming) or rewritable (reconfigurability). A PLD is configured either during the manufacture of the system or during operation, for example:

during the boot phase,
during changing applications while the system is operating,
periodically when subfunctions are sequentialized or
by dynamic self-modification (self-reconfiguration).

In the past, typical solutions when using programmable logic components, in particular FPGAs, have been to load the configuration data into the logic component 30 via the printed circuit board. FIG. 2 shows the schematic design of such a solution. In this context, in addition to the logic component 30 at least one further component 20 is also necessary for permanently making available the configuration data. This is usually a non-volatile memory which can be embodied as a rewritable medium (EEPROM, Electrically Erasable and Programmable Read Only Memory). The data is fed to the logic component 30 from the memory component 20 via the configuration data bus 42 which is routed via the printed circuit board. The width of the configuration data bus 42 is typically 32 bits, while configuration words with data quantities of the order of magnitude of 1 Mbit are required to configure a programmable logic component. The width of the configuration data bus 42 is therefore significantly less than the length of the configuration word, for which reason the configuration data is transmitted in a sequential form. For this reason, a configuration changeover usually requires a large number of machine cycles (in the above estimate: $2^{20-5}=32768$ cycles), which typically results in an operating break in the logic component 30 of a few milliseconds depending on the clock rate of the configuration bus 42. A configuration changeover is therefore incompatible with real-time applications.

Owing to the sequential transmission of the configuration data, said data also has to be stored in local memory cells 34, for example SRAM cells. They take up a significant proportion of the surface area of the logic component 30 since typically 1 Mbit configuration data has to be buffered for 10 000 logic cells, for example.

The memory cells 34 are interlinked on the surface of the logic component 30 with the matrix of the logic elements 33. The memory cells 34 are thus local clusters of SRAM cells so that no optimized SRAM cells can be used compared to large-area SRAM arrays, which signifies an additional increase in area.

The most important disadvantages of the described solution are the economic reasons (area requirement) and the limited miniaturizability of the system structure.

Furthermore there are solutions in which a configuration memory component and a logic component are connected within a common housing by means of bond wires. The advantage of this solution is the already increased degree of miniaturization. The technical disadvantages of this solution are the limited bandwidth for the exchange of data and the continuing need to buffer it locally. The reconfiguration continues to be a sequential process and takes place rarely owing to the associated breaks in operation.

A third way of arriving at a solution is to form the local memory cells 34 on the logic component 30 from non-volatile cells. These are typically embedded EEPROM cells (embedded flash). In this way the external configuration memory and the internal SRAM cells are dispensed with. Since an EEPROM cell requires only approximately a third of the area of a SRAM cell, this provides an area saving on the logic component 30. This advantage is gained at the expense of the fact that when local EEPROM cells are used the programming voltage for programming the EEPROM cells has to be generated on the chip, for which purpose voltage transformers are required. However, the significant and very expensive disadvantage of this solution is the need to combine two different semiconductor technologies on one chip and to make available a semiconductor technology which optimizes both EEPROM cells and configurable cells.

Accordingly, there is a need for improved devices for construction and a simplified method for operation of a cost-effective programmable logic component which can be used in a flexible way.

BRIEF SUMMARY

A first device according to one embodiment of the present invention relates to a configurable logic component which does not have a configuration memory. The configuration of the logic component is defined by means of voltages applied to electrical connections. According to an embodiment of the invention, these are continuous or d.c. voltages. The entirety of the applied configuration voltages forms a set of configuration voltages which defines a configuration of the logic component. The number of available electrical connections which are insulated from one another determines the width of the configuration bus. The width of the configuration bus is greater than or equal to the number of configuration voltages which have to be applied in order to set the desired configuration. This permits configuration data to be fed in parallel into the configurable logic component by means of a set of configuration voltages.

By preventing a sequential transmission of data it is possible to dispense with buffering configuration data in local configuration memories which are arranged within the configurable logic component.

A set of configuration voltages defines the configuration data in a compressed or expanded form. In the expanded form of data, a configuration voltage corresponds to precisely one configuration bit for the configurable logic component. The configuration voltages are therefore used directly to configure the configurable cells of the configurable logic component without further processing. The configurable cells comprise the logic cells and the connection network of the logic component. In contrast to this, with a compressed form of data a configuration voltage defines a plurality of configuration bits. For example, a 1 out of N code (one-shot-only) can be expressed by means of a compressed form of data. The compressed data is expanded within the configurable logic component using an expansion logic. However, a compressed form of data of the configuration word can also be achieved by using multi-level voltages. In such a case a configuration voltage constitutes a multi-bit symbol which describes a plurality of configuration bits for the configurable logic component. The expansion logic itself may in turn be configurable in order to be able to expand various types of the compressed form of data.

The parallel supply of configuration data in the form of configuration voltages is used for a new, simplified architecture of the configurable logic component in which the storage of configuration data in local memory cells (memory cells 34 in FIG. 2) is completely eliminated. The configuration voltages are continuously applied during the period of validity of the desired configuration.

A further embodiment according to the present invention relates to a programmable logic component which has a configurable logic component as described above, a memory component with a configuration memory and electrical connections between the configurable logic component and the memory component. The configurable logic component is configured here using configuration voltages which are generated within the memory component and supplied to the configurable logic component via the electrical connections.

The configuration voltages are generated according to a configuration word which is stored in the configuration memory and form a set of configuration voltages. The set of configuration voltages is applied during the period of validity of the selection of the configuration word.

In one advantageous refinement of the present invention, a plurality of configuration words which can be accessed using multiplexer structures are stored in the configuration memory. The selection of the configuration word can be controlled here by the configurable logic component itself or by some other circuit unit. According to the selection of a new configuration word, a new set of configuration voltages is generated and the configurable logic component is reconfigured. The programmable logic component is thus reprogrammed. A rapid configuration changeover is possible by virtue of the parallel exchange of configuration data between the configuration memory and configurable logic component. In an ideal case, the configurable logic component or the programmable logic component is reconfigured or reprogrammed within one machine cycle. As a result, multiple use of the programmable logic component for various tasks, for example in real-time applications, is possible.

In a further preferred embodiment, the data which is processed by the configurable logic component is kept within the logic cells or some other memory element during the configuration changeover and after the configuration changeover is further processed using the new configuration.

In a further advantageous refinement of the invention, the configuration changeover of the configurable logic component relates to only part of the configurable cells. For this purpose, the configurable logic component is divided into a plurality of segments. In each case a number of selectable configuration words within the configuration memory are available for each segment of the configurable logic component. The various segments of the configurable logic component are configured independently of one another. The flexibility when configuring the configurable logic component is thus increased.

A further device according to an additional embodiment of the present invention relates to an integrated circuit with a configurable logic component and electric feed lines as described above. The configurable logic component receives its configuration by means of externally supplied voltages and dispenses with a local configuration memory. As a result, the structure of the configurable logic component on the integrated circuit can be optimized.

By eliminating the buffering in local memory cells, a higher density of the configurable logic components on the integrated circuit is achieved. The ratio of configuration overhead to useable logic which was previously very unfavourable in logic components is perceptibly improved.

This is apparent, on the one hand, in an increased degree of miniaturization of the device. This permits cost-effective housings to be used as well as allowing the device to be implemented, for example, in chip cards. Furthermore, the manufacture of the integrated circuit is simplified since the semiconductor technology only has to be optimized to manufacturing the configurable cells. In addition, the connection lengths in the connection network can also be shortened, which has a positive effect on the energy balance of the logic component.

The configurable logic component can extend here over a plurality of integrated circuits. Furthermore, it may be advantageous to arrange not only the configurable logic component but also further modules on the integrated circuit.

A further embodiment according to the invention relates to a programmable logic component which contains a first integrated circuit with configurable logic component, as described above, as well as a second integrated circuit with a memory component with configuration memory. The two integrated circuits are mounted face-to-face, i.e. the integrated circuits are joined by their active sides. In this configuration, the transistors and metallization levels of the upper integrated circuit are reflected onto the metallization levels and transistors of the lower integrated circuit. An intermediate, structured solder layer forms a plurality of electrical connections, insulated from one another, between the two integrated circuits. The solder layer is mechanically very stable.

This structure technique provides the following advantages:
large number of connections which are electrically insulated from one another;
very short and protected connections;
integration of different semiconductor technologies;
simplification of the architecture of logic components; and
maximum degree of miniaturization of the structure.

The large number of electrical connections permits broadband or parallel access to the logic component within the first integrated circuit in order to transmit configuration data from the configuration memory of the second integrated circuit. The electrical connections are heavily protected within the structured solder layer and thus increase the operational reliability as a result of the protection against, for example, disruptive interference and data protection against possible monitoring attacks. Owing to the mechanical stability of the solder layer, there is a high probability that the integrated circuits will be mechanically damaged and the data destroyed in such a case.

As a result of the face-to-face structure technique, semiconductor chips which are manufactured using different technologies can be connected and the more costly alternative of embedded technologies or of integrating a plurality of semiconductor technologies when manufacturing an integrated circuit is thus avoided. The manufacturing process of the two semiconductor chips can therefore be optimized with respect to the particular semiconductor technology, which is manifested in a high degree of miniaturization and a cost effective method of manufacture. In the present invention it is possible to dispense with local memory cells in the logic component or on the first integrated circuit. The very high degree of miniaturization permits cost-effective housings to be used as well as allowing implementation in chip cards.

For optimum use it is favourable if the connection grids of memory cells on the one hand and configuration switches of the configurable cells on the other overlap as far as possible.

Using an architecture which can be configured to a high degree together with a reprogrammable read-only memory (for example EEPROM) provides a cost-effective platform. There is a further advantage in the additional security aspects because the programmable logic component has a regular layout. It is therefore not possible to infer the function from the structure. This also applies to a limited degree to the memory component in the form of an EEPROM in which only the programming determines the function. In the case of face-to-face soldering it is possible to assume that if the memory component and the logic component are disconnected, there will be a high probability of damage occurring which makes it difficult to reconstruct the memory contents. The face-to-face mounting increases the expenditure required to spy out the circuit to such an extent that at least one corresponding piece of equipment is necessary.

The face-to-face mounting supports embedded configurability because as a result all the system components can be combined in one chip housing.

In one preferred embodiment, both integrated circuits lay congruently one opposite the other. As a result, the length of the electrical connections between the two integrated circuits is minimized, which has an advantageous effect on the energy balance. Furthermore, this maximizes the operational reliability and data security.

If the two integrated circuits have different areas, the smaller integrated circuit is located centrally on the larger integrated circuit, the electrical connections extending radially between the two integrated circuits.

If a significantly smaller memory element than the logic component can be selected, it is also conceivable to store a plurality of configuration words in the memory component.

In a method for configuring a configurable logic component according to a further embodiment of the invention, the configuration of the logic component is defined by means of a set of configuration voltages which are fed to the configurable logic component via electric feed lines. The configuration voltages define a configuration and are applied continuously for the duration of validity of the configuration. The configuration voltages are d.c. voltages.

The permanent supply of the configuration data in the form of continuously applied configuration voltages makes it possible to dispense with the buffering of configuration data within the logic component, as a result of which the structure of the configurable logic component according to the invention is simplified.

In the method according to some embodiments of the invention for programming a programmable logic component, a configuration word is stored in a configuration memory. The configuration word defines a set of configuration voltages here. In accordance with the above method according to the invention, a configurable logic component is configured using the set of configuration voltages.

In one advantageous refinement, the set of configuration voltages is generated within a memory component which also comprises the configuration memory.

In the method according to the invention for reprogramming a programmable logic component, a plurality of configuration words is stored in the configuration memory. The selection of a configuration word determines the resulting configuration of the configurable logic component and/or the programming of the programmable logic component. The selection of a configuration word is retained for the duration of the validity of the associated configuration. By selecting a new configuration word, the configurable logic component is reconfigured and the programmable logic component is newly programmed or reprogrammed.

The access to one of the configuration words stored in the configuration memory can then be carried out using multiplexer structures.

In one advantageous refinement of the method, the reconfiguration of the configurable logic component or the reprogramming of the programmable logic component takes place within one machine cycle. The configuration data is transmitted in parallel in the form of continuously applied configuration voltages. The selection of a new configuration word and the generation of the associated set of configuration voltages is therefore the determining factor for the timing of the reprogramming of the programmable logic component. These steps take place within one machine cycle given a suitable structure of the memory component. The reprogramming of the programmable logic component therefore takes place within one machine cycle. The resulting operating break of the logic component comprises one machine cycle.

In a further advantageous refinement, the reconfiguration does not relate to the entire logic component but rather only to a number of segments into which the logic component is divided. For each segment it is possible to select from among a number of associated configuration words. These methods are also referred to as paging.

The division of the logic component into segments permits parallel data processing in the individual segments of the configurable logic component as well as rapid, independent reconfiguration of the various segments. In particular, individual segments of the configurable logic component can be reconfigured, while other segments continue the data processing or are still occupied with processing an ongoing task. After this, a very rapid task changeover can take place. The high speed of the reconfiguration supports dynamic task generation. The possibility of tasks running in parallel as well as their rapid configuration makes a new form of programmable computers possible.

A method according to one embodiment of the present invention for processing data in a programmable logic component has a plurality of processing steps. The programmable logic component is reprogrammed between a first work step and a second work step. The data is buffered during the resulting break in the operation of the logic component. The data is advantageously buffered in the configurable logic cells of the logic component or a special data memory. The reprogramming of the programmable logic component can relate to the reconfiguration of the entire configurable logic component or only to a number of segments of the configurable logic component.

The devices and methods according to the invention support multiple use of a configurable or programmable logic component. The programmable logic component can be used for a plurality of tasks which occur simultaneously or in parallel. Typical applications are algorithms for packet processing in which a relatively large quantity of data is processed in a first processing step, and the next step is based on the previously calculated set of data.

The devices and methods according to the invention support the rapid configuration changeover and at the same time facilitate the multiple use of the programmable logic component in real-time requirements. After a very short break in operation for the reprogramming, the data can be further processed. At the same time, the data can be buffered during the configuration changeover in the flip-flops of the configurable logic cells or in a data RAM (Random Access Memory).

DETAILED DESCRIPTION OF THE PRESENTLY PREFERRED EMBODIMENTS

Figure 1A:
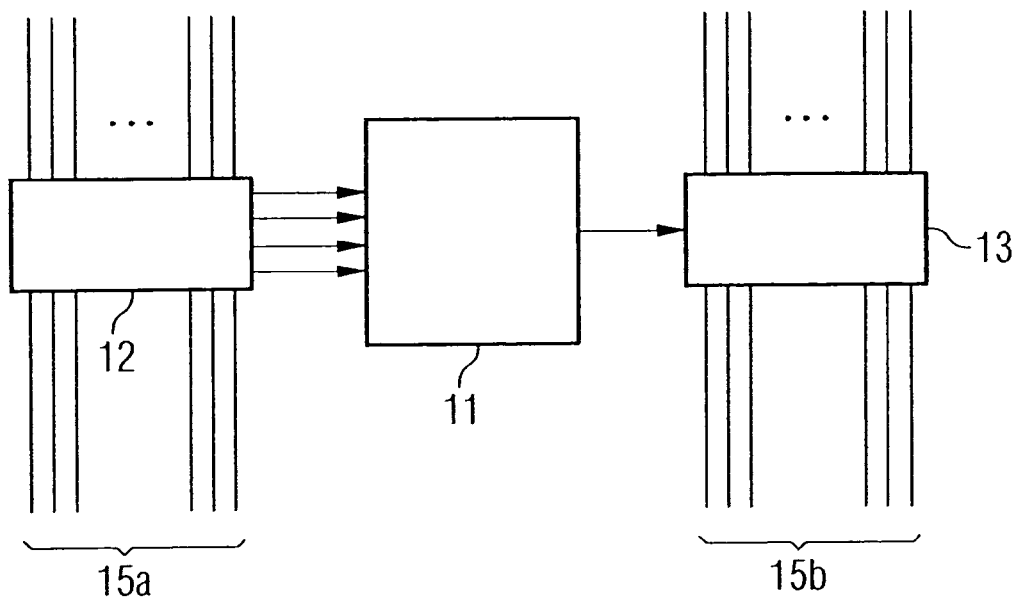
FIGS. 1a and 1b show cell types of a logic component.
Figure 1B:
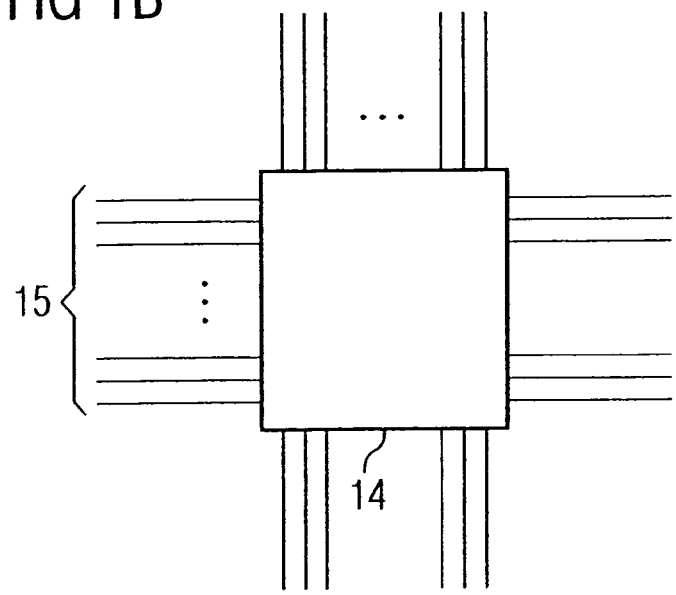

The four cell types which occur in general within a logic component, for example a programmable logic component or an FPGA, are illustrated in FIGS. 1a and 1b. Configurable logic cells 11 are used for signal processing at the bit level. Configurable tap cells 12 tap as many signals as the logic cell 11 has inputs from a data bus 15a. Configurable feed cells 13 feed the output signal of the logic cell 11 to a further data bus 15b. Configurable coupling cells 14 are matrices for the optional and bidirectional switching of signal paths (wiring) in the connection network of a logic component 30.

A typical implementation of a configurable logic cell 11 uses look-up tables (lut). In what follows, a look-up table (lut4) with four input signals and an output signal is assumed as an example. The table requires 16 configuration signals for non-restricted configurability. The flip-flop connected downstream and the multiplexer require approximately 5 configuration bits in total. The clock selection for, for example, four different clock cycles requires 2 bits. Overall, a configurable logic cell 11 therefore requires approximately 25 to 30 bits to configure it.

A configurable tap cell 14 can select among N inputs for each of its M outputs. If this selection is exclusive, that is to say with compressed coding, M×1d(N) bits are required. The one-shot-only (1 out of N) decoding is carried out in the cell so that the number of connections of the configuration memory is minimized. This results in 16 configuration bits for M=4 and N=16.

A configurable feed cell 13 can distribute each of its K inputs among L outputs. The maximum number of useable outputs is determined by the driver capability (FO, fan-out), i.e. FO of L connections can be set simultaneously. For K=1, FO=2 and L=16 a maximum of 16 configuration bits is possible.

A configurable coupling cell 14 can select 3×P outputs for each of its four sides for each of its O inputs in each case. In order to make the selection, a maximum ½×4×O×3×P configuration bits are required. Assuming that this selection is exclusive, ½×4×O×3×1d(P) configuration bits are required with compressed coding. If O=16 and P=1, 96 configuration bits are thus obtained.

Given the above estimate of the architecture, a total of approximately 160 configuration bits per logic cell is required computationally. In order to come closer to the objective of a small number of configuration bits, it is however also possible to use potentials for savings.

Figure 2:
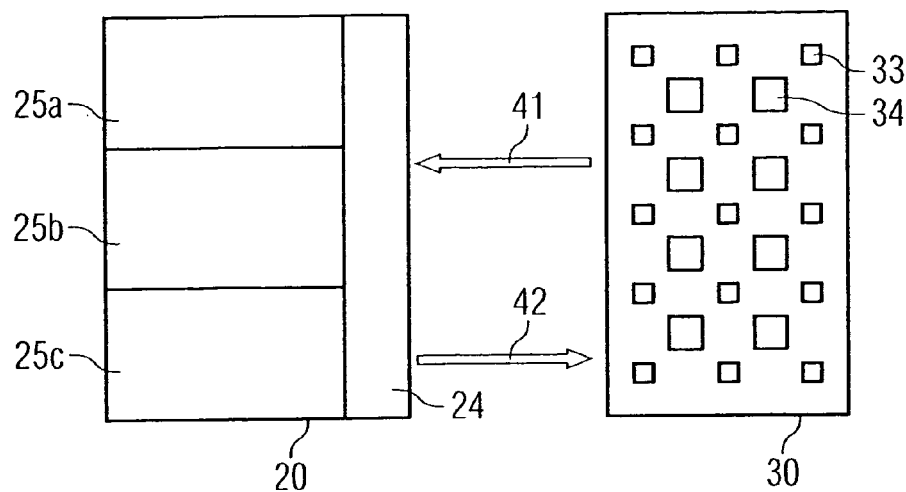
FIG. 2 shows a schematic structure of a logic component with a local configuration memory and external permanent memory.

In FIG. 2, the schematic structure of a programmable logic component according to the prior art is illustrated. The memory component 20 is configured as a read-only memory, and a plurality of configuration words 25a-25c can be stored.

The request to reconfigure the logic component 30 is transmitted to the memory component 20 via the control line 41. The memory component transmits the configuration data to the logic component 30 via a sequential configuration data bus 42. The configuration data is buffered in local memory cells 34 of the logic component 30. The local memory cells 34 are interconnected to the matrix of the configurable cells 33 and feed the respective configuration data to the latter.

Figure 3:
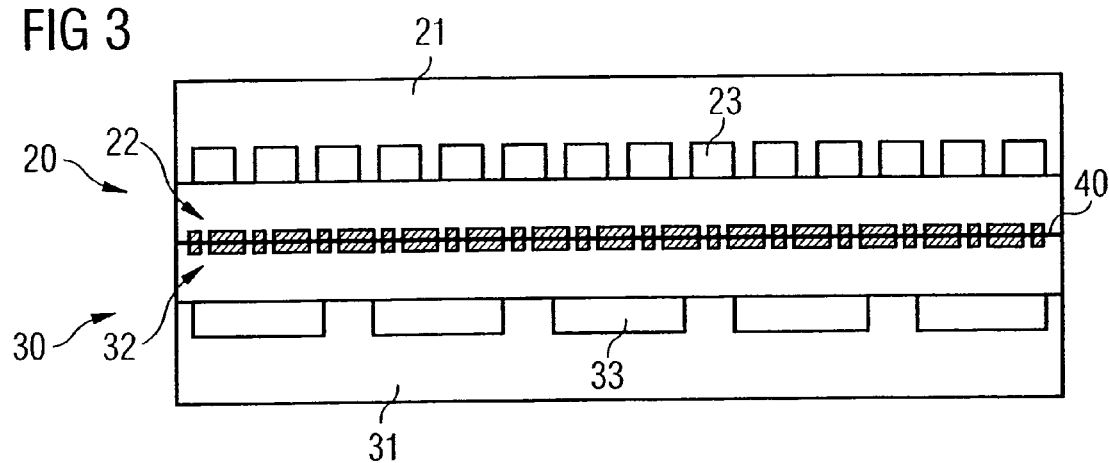
FIG. 3 shows the inventive face-to-face mounting of a logic component and of a memory component.

The inventive face-to-face mounting of a logic component 30 with a memory component 20 is illustrated in FIG. 3. In the lower part of the figure, the semiconductor layer 31 of the logic component 30 with the configurable cells 33 is shown, and in the upper part the semiconductor layer 21 of the memory component 20 with the memory cells 23 is shown. The metallization layers 22 and 32 of the two semiconductor components lie opposite one another and are connected by means of a solder layer 40. The solder layer 40 brings about a mechanically very stable connection between the two semiconductor components 20 and 30. The solder layer 40 is structured, producing a plurality of conductive connections, insulated from one another, between the two semiconductor components 20 and 30.

This permits data to be exchanged in parallel for the configuration, which exchange is utilized for a new, simplified architecture in which the storage of configuration data in local memory cells (34 in FIG. 2) is completely eliminated.

As a result of the face-to-face mounting of a logic component 30 with a memory component 20, the configuration memory and the configurable matrix array are placed very close to one another. This permits a parallel, high-speed and protected data flow as well as a simplification of the system architecture.

For a 0.18 µm technology this would signify, for example: given an assumed array size of 10 mm² for 10 000 configurable logic cells and a configuration word of 1 Mbit, a contact density of 100 000 mm$^{-2}$ or 316 m$^{-1}$ (contact grid approximately 3.0 μm) is obtained.

Figure 4:
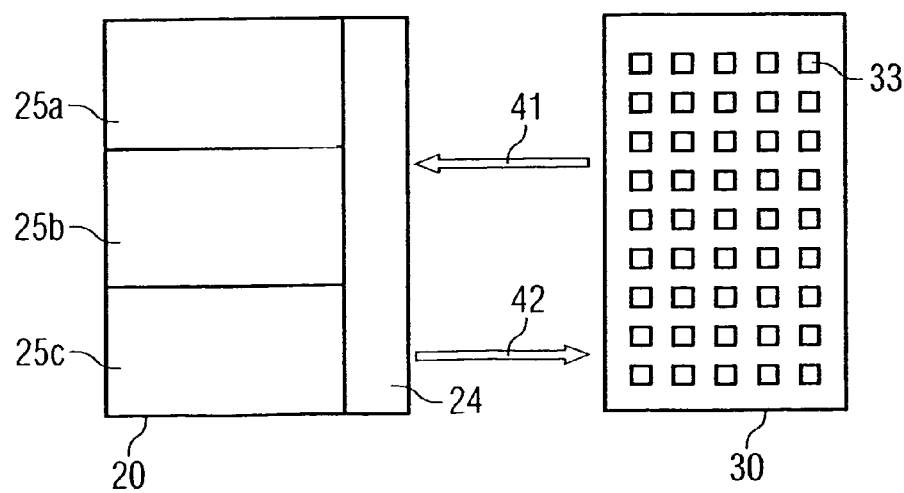
FIG. 4 shows a schematic structure of a logic component according to the invention without a local configuration memory.

FIG. 4 shows the schematic structure of an exemplary embodiment of the programmable logic component according to the invention. The memory component 20 is a non-volatile read-only memory (ROM) which is either programmed once during fabrication (PROM) or is rewritable (EPROM or EEPROM).

A plurality of configuration words 25a to 25c are stored in the memory component 20 in order to continuously make available configuration data. A request for reconfiguration of the logic component 30 is transmitted, and a configuration word selected, via the control line 41. In the present exemplary embodiment, the selection of the configuration word is controlled by the logic component itself. However, it is also conceivable for a different switching unit to control the configuration of the configurable logic component. The control line 41 has, for example, a width of 5 bits. The control signals on the control line 41 determine the time behaviour (the causality) of the read access and optionally entry addresses if a plurality of configurations are held in parallel. The conversion of symbolic addresses into physical addresses takes place in the interface 24 of the memory component 20.

According to the selected configuration word, a set of configuration voltages is generated within the memory component and transmitted to the local component 30 via the configuration data line 42. The selected configuration data can be transmitted in parallel using the set of configuration voltages in the form of d.c. voltages by virtue of the high bandwidth of the data line 42 between the memory component 20 and the logic component 30. The configuration voltages are fed to the configurable cells 33 without further buffering, as a result of which it becomes superfluous to use local memory cells (34 in FIG. 2).

On the logic component 30 there are typically 5000 logic cells for which approximately 200 bits are required in each case together with the associated connection network according to the estimate above. For this reason, approximately 1 Mbit configuration data is transmitted in a very long word.

If the correct entry address is calculated and the address is incremented in the interface 24 of the memory component 20, the bandwidth of the data bus 42 is thus completely available for conveying the configuration data.

Figure 5:
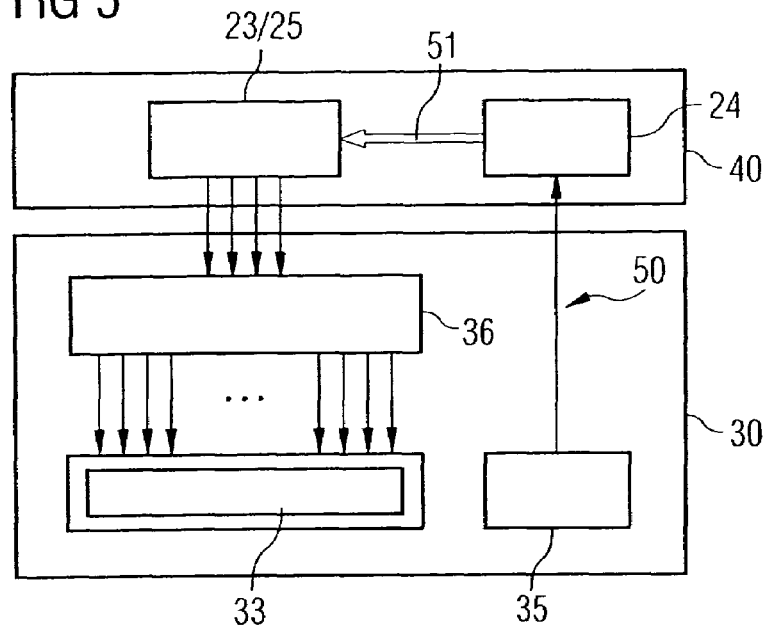
FIG. 5 shows a set of configuration voltages with a compressed form of data with subsequent expansion.

FIG. 5 illustrates the expansion of the configuration data with compressed transmission using an expansion logic 36. The expansion is carried out without buffering of the configuration data. Expansion is necessary if the configuration data 25 is stored in the memory component 20 by means, for example, of 1 out of N coding (one-shot-only) in a compressed form. In the case of 1 out of N coding, precisely 1 bit is selected from N=2$^n$ bits. The bit to be selected can be described to unambiguously using n transmitted bits. A further possibility for compressed coding is to transmit multi-bit symbols from the memory component 20 to the logic component 30 using, for example, multi-level voltages. The conversion of symbolic addresses 50 into physical addresses 51 takes place in the interface 24 of the memory component 20. The configuration changeover is controlled by a control unit 35 which is arranged within the logic component 30 in the exemplary embodiment in FIG. 5.

Figure 6:
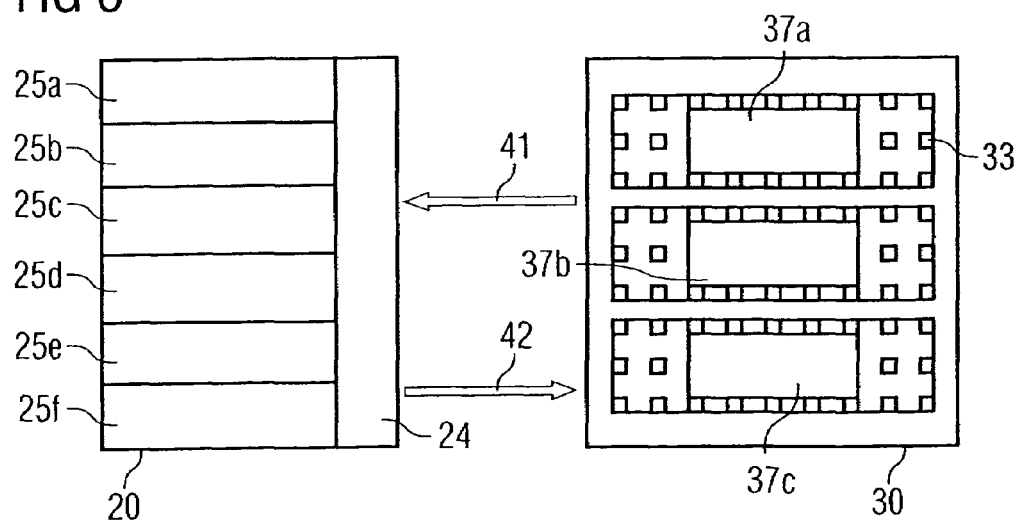
FIG. 6 shows a diagram of a segmented architecture.

FIG. 6 illustrates the segmentation of the logic component 30 or what is referred to as paging. The logic component 30 is divided here into a plurality of component faces or segments 37a-37c. The individual segments 37a-37c can be configured and reconfigured independently of one another, while other segments are occupied with processing another task or an ongoing task. A very fast track changeover can then take place. The high speed of reconfiguration supports dynamic task generation. The possibility of tasks running in parallel and their rapid reconfiguration make a new form of programmable computers possible.

From the foregoing, it can be seen that an improved device and operation method for a programmable logic component have been developed. In place of a configuration memory, the configuration of the configurable logic component is defined by applied voltages which are generated in an external configuration memory. The logic component and the configuration memory are preferably mounted face to face. In this manner, different semiconductor technologies such as EEPROM and configurable logic cells may be readily combined, device size and power consumption are reduced and rapid and selective reconfiguration of portions of the configurable logic component are achieved.

It is therefore intended that the foregoing detailed description be regarded as illustrative rather than limiting, and that it be understood that it is the following claims, including all equivalents, that are intended to define the spirit and scope of this invention.

The invention claimed is:

1. A programmable logic device, comprising:
 a configurable logic device, the configuration of which device is defined by means of applied configuration voltages,
 a memory device with a configuration memory, wherein a surface of the configurable logic device is connected to a surface of the memory device by an electrically conductive layer, the electrically conductive payer being structured to form a plurality of electrical connections between the configurable logic device and the memory device, wherein the number of electrical connections is greater than the number of configuration voltages which have to be applied in order to set the desired configuration of the configurable logic device.

2. The programmable logic device according to claim 1, wherein the configuration voltages represent configuration bits.

3. The programmable logic device according to claim 1, wherein the configuration memory makes available a number of selectable configuration words according to which the configuration voltages are generated.

4. The programmable logic device according to claim 3, wherein the configurable logic device comprises a plurality of segments, and a number of configuration words are available for each segment and the segments are configured independently of one another.

5. An integrated circuit, comprising the configurable logic device according to claim 1.

6. A programmable logic device according to claim 1, comprising:
 a first integrated circuit, containing the configurable logic device; and
 a second integrated circuit which contains the memory device with the configuration memory,
 the active sides of the first integrated circuit and the second integrated circuit lying opposite one another and the electrical connections being formed by an intermediate, structured solder layer.

7. A programmable logic device according to claim 6, characterized in that the first integrated circuit and the second integrated circuit have overlapping active faces.

8. A programmable logic component according to claim 1, characterized in that the configuration memory is embodied as a non-volatile memory.

9. A programmable logic component according to claim 8 wherein the configuration memory comprises a programmable non-volatile memory.

10. A programmable logic device, comprising:
a first integrated circuit containing a configurable logic device, the configuration of which device is defined by means of applied configuration voltages,
a second integrated circuit containing a memory device with a configuration memory,
the active sides of the first integrated circuit and the second integrated circuit lying opposite one another and electrical connections between the configurable logic device and the memory device being formed by an intermediate, structured solder layer, wherein
a plurality of individually selectable configuration words are stored in the configuration memory, the configuration words representing different configurations of the configurable logic device and the selection of a particular configuration word determines a particular configuration of the different configurations of the configurable logic device and according to the selection of the particular configuration word, the configuration voltages are generated.

11. A programmable logic device according to claim 10, characterized in that the first integrated circuit and the second integrated circuit have overlapping active faces.

12. A programmable logic component according to claim 10, characterized in that the configuration memory is embodied as a non-volatile memory.

13. A programmable logic component according to claim 12 wherein the configuration memory comprises a programmable non-volatile memory.

* * * * *

UNITED STATES PATENT AND TRADEMARK OFFICE
CERTIFICATE OF CORRECTION

PATENT NO. : 7,348,795 B2  Page 1 of 1
APPLICATION NO. : 11/032436
DATED : March 25, 2008
INVENTOR(S) : Michael Scheppler et al.

It is certified that error appears in the above-identified patent and that said Letters Patent is hereby corrected as shown below:

On the Title Page

In column 1, before item (21), delete "This patent is subject to a terminal disclaimer.".

In column 10, claim 1, line 33, after "electrically conductive" delete "payer" and substitute --layer-- in its place.

Signed and Sealed this

Twenty-fourth Day of March, 2009

JOHN DOLL
*Acting Director of the United States Patent and Trademark Office*